(12) United States Patent
Shiozawa et al.

(10) Patent No.: US 7,888,928 B2
(45) Date of Patent: Feb. 15, 2011

(54) COMPONENT TEST APPARATUS HAVING A PAIR OF ROTARY TRANSPORT HANDS

(75) Inventors: Masakuni Shiozawa, Chino (JP); Hiroaki Fujimori, Suwa (JP)

(73) Assignee: Seiko Epson Corporation (JP)

( * ) Notice: Subject to any disclaimer, the term of this patent is extended or adjusted under 35 U.S.C. 154(b) by 95 days.

(21) Appl. No.: 12/369,919

(22) Filed: Feb. 12, 2009

(65) Prior Publication Data
US 2009/0201040 A1 Aug. 13, 2009

(30) Foreign Application Priority Data
Feb. 13, 2008 (JP) ............................. 2008-032165

(51) Int. Cl.
*G01R 31/02* (2006.01)
(52) U.S. Cl. ................ 324/158.1; 324/765; 414/222.13
(58) Field of Classification Search ........................ None
See application file for complete search history.

(56) References Cited

U.S. PATENT DOCUMENTS 5,708,222 A * 1/1998 Yonezawa et al. .......... 73/865.8
5,919,024 A * 7/1999 Fujimori ................. 414/225.01
5,957,305 A * 9/1999 Takahashi ................... 209/573
6,518,745 B2 2/2003 Kim et al.

FOREIGN PATENT DOCUMENTS

| JP | 64-009378 | 1/1989 |
|---|---|---|
| JP | 2002-148307 | 5/2002 |
| JP | 2002-196042 | 7/2002 |

* cited by examiner

*Primary Examiner*—Minh N Tang
(74) *Attorney, Agent, or Firm*—Harness, Dickey & Pierce, P.L.C.

(57) ABSTRACT

A component test apparatus performing a test on an electronic component is disclosed. The component test apparatus includes a component loading device, a transport hand, and a component unloading device. The transport hand includes a plurality of index units each one of which is capable of holding the electronic component and operating independently from the other ones of the index units. The index units are aligned adjacently in a transport direction of the electronic component extending from a loading position at which the component loading device loads the electronic component toward a test position at which a test socket is provided.

3 Claims, 6 Drawing Sheets

COMPONENT TEST APPARATUS HAVING A PAIR OF ROTARY TRANSPORT HANDS

CROSS-REFERENCE TO RELATED APPLICATION

This application is based upon and claims the benefit of priority from prior Japanese Patent Application No. 2008-032165 filed on Feb. 13, 2008, the entire content of which is incorporated herein by reference.

BACKGROUND

1. Technical Field

The present invention relates to a component test apparatus that performs tests on electronic components.

2. Related Art

Typically, various tests are performed on an electronic component such as a semiconductor chip when the electronic component is manufactured. The tests normally involve the use of a component test apparatus referred to as an IC handler. The component test apparatus has a plurality of transport devices that transport an electronic component, or a test subject, to predetermined positions (which are, for example, a loading position, a test position, and an unloading position) in the component test apparatus. Through the transport devices, the electronic component is supplied to the component test apparatus and arranged in a test socket provided in the component test apparatus before a test is carried out. After the test is completed, the transport devices remove the electronic component from the test socket and unload the electronic component from the component test apparatus. Specifically, for example, an electronic component to be tested is mounted on a shuttle by a loading robot serving as one such transport device. The shuttle then carries the electronic component to be tested to a position in the vicinity of the rest socket. At this position, a measurement robot (a transport hand) serving as another transport device holds the electronic component up from the shuttle, transports the electronic component to the test socket, and arranges the electronic component in the test socket. After the test is completed, the measurement robot holds the electronic component up from the test socket and mounts the electronic component onto the shuttle. The shuttle then transports the electronic component that has been tested to a position in the vicinity of a collection robot serving as another transport device. Afterwards, the collection robot then holds the electronic component and mounts the electronic component on a collection tray that corresponds to the result of the test.

Conventionally, there has been a demand for a component test apparatus that can perform a test on a great number of electronic components in a short time. To meet the demand, as a method of shortening the time required for the component test apparatus to carry out a test, Japanese Laid-Open Patent Publication No. 2002-148307, for example, discloses a method of decreasing the time needed for replacement of electronic components with respect to a test socket. According to the method, the component test apparatus, which is an IC handler, includes a plurality of test sockets aligned along a line and multiple pairs of transport hands. Each pair of the transport hands are arranged in such a manner as to straddle the corresponding one of the test sockets. Each of the transport hands has a suction mechanism that pulls and holds an electronic component and a pressing mechanism that presses the electronic component into a test socket. The hands of each pair of the transport hands, or a first transport hand and a second transport hand, operate independently from each other. While the first transport hand is pressing the electronic component into the test socket, the second transport hand holding another electronic component that is to be pressed into the test socket subsequently is maintained in a standby state at a position maximally close to the first transport hand. This decreases the distance covered by transport of the electronic components when the electronic components are replaced with respect to the test socket. Accordingly, the total time required for the component test apparatus to conduct a test is shortened.

The time consumed by a test on an electronic component using a test socket varies depending on the content of the test. In some cases, the time required to transport the electronic component, which is, for example, the time required to unload the electronic component to a shuttle after the test is completed or the time required to hold the electronic component up from the shuttle and move the electronic component to a position in the vicinity of the test socket before the test is started, is longer than the time consumed by the test on the electronic component. In these cases, the method of the aforementioned publication cannot always shorten the total time necessary for completion of the test. In other words, the test on the electronic component that has been arranged in the test socket by the first transport hand may end before transport of the subsequent electronic component by the second transport hand is completed. In this case, the second transport hand cannot be held in a standby state in the vicinity of the first transport hand. Further, the transport hands unload and load the electronic components each time the test is performed. As a result, operation involving such unloading and loading imposes a limit on shortening the total transport time.

SUMMARY

Accordingly, it is an objective of the present invention to provide a component test apparatus that improves the throughput of a test on electronic components by shortening the time required for replacement of electronic components with respect to a test socket.

To achieve the foregoing objective and in accordance with one aspect of the present invention, a component test apparatus performing a test on an electronic component is provided. The apparatus includes a component loading device that loads the electronic component to a loading position, a transport hand, and a component unloading device. The transport hand is capable of holding the electronic component so as to transport the electronic component from the loading position to a test socket arranged at a test position, and to transport from the tested test socket to an unloading position. The component unloading device unloads the electronic component from the unloading position. The transport hand includes a plurality of index units each one of which is capable of holding the electronic component and operating independently from the other ones of the index units. The index units are aligned adjacently in a transport direction of the electronic component extending from the loading position toward the test position.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawing in which:

DESCRIPTION OF EXEMPLARY EMBODIMENTS

Figure 1:
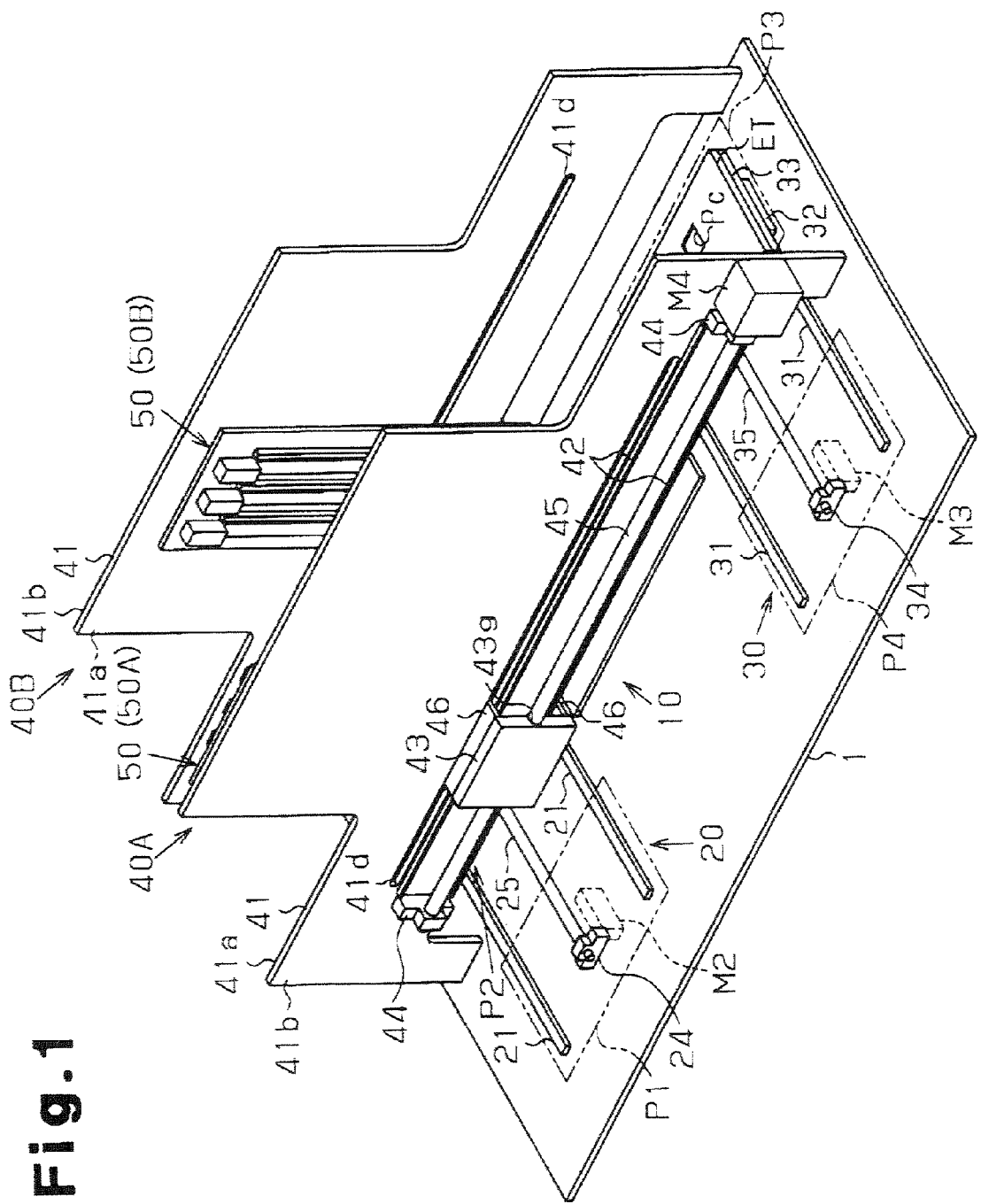
FIG. 1 is a perspective view showing a component rest apparatus according to one embodiment of the present invention.

One embodiment of the present invention will now be described with reference to FIGS. 1 to 11B. FIG. 1 is a perspective view showing a component test apparatus according to the embodiment.

As shown in FIG. 1, the component test apparatus of the present embodiment has a substantially rectangular base 1. A component test portion 10, which is also formed substantially in a rectangular shape, is arranged on the top surface of the base 1 at a position at the longitudinal center of the base 1 and in a rear position with respect to a direction (a width direction) perpendicular to the longitudinal direction. A component loading device 20 serving as component loading means is formed on the top surface of the base 1 at one side (the left side as viewed in FIG. 1) along the longitudinal direction of the component test portion 10. A component unloading device 30 serving as component unloading means is provided on the top surface of the base 1 at the other side (the right side as viewed in FIG. 1) along the longitudinal direction of the component test portion 10.

Figure 2:
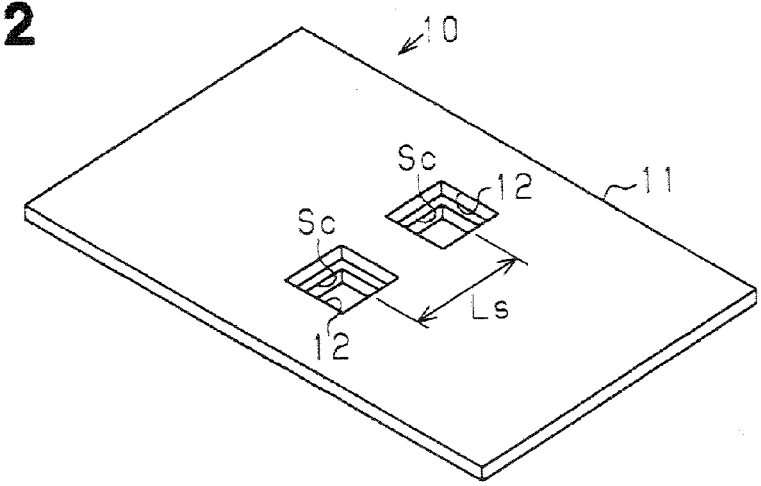
FIG. 2 is a perspective view showing a component test portion of the component test apparatus illustrated in FIG. 1.

As shown in FIG. 2, the component test portion 10 has an upper support body 11 having a substantially rectangular shape and a lower support body (not shown) also having a substantially rectangular shape, which is arranged below the upper support body 11. The lower support body is sized slightly smaller than the upper support body 11. Two through holes 12 extend through the upper support body 11. The centers of the through holes 12 are spaced apart at an interval Ls in the width direction of the upper support body 11. A test socket Sc is arranged and fitted in a portion of the lower support body corresponding to each of the through holes 12. The interval between the centers of the two test sockets Sc is referred to also as the interval Ls.

Each of the test sockets Sc electrically connects an electronic component T (see FIG. 3) arranged in the test socket Sc to a non-illustrated test device. Specifically, each test socket Sc includes a plurality of non-illustrated contact pins each one of which corresponds to a one of a plurality of non-illustrated connection pins that are provided in the electronic component T. The contact pins are electrically connected to corresponding terminals of the test device, which performs an electrical test on the electronic component T. As the electronic component T is arranged in the corresponding one of the test sockets Sc, the connection pins of the electronic component T are electrically connected to the corresponding contact pins. This allows the test device to perform the electrical test on the electronic component T.

The component loading device 20, as illustrated in FIG. 1, loads the electronic component T to be tested, which is mounted on a loading tray (not shown), from a position forward in the width direction of the base 1, which is a tray replacement position P1 spaced from the component test portion 10, to a position rearward in the width direction of the base 1, or a loading position P2 in the vicinity of the component test portion 10. Specifically, the component loading device 20 has a pair of rails 21 extending from the tray replacement position P1 to the loading position P2 along the width direction of the base 1. A tray support body (not shown) having a rail receiver (not shown), which moves on the rails 21, is mounted on the rails 21. The loading tray having a plurality of pockets Pc, which are to hold electronic components T, is mounted on the top surface of the tray support body. A ball screw 25 is provided between the rails 21 and extends parallel with the rails 21. Each end of the bail screw 25 is rotatably supported by a holder 24 secured to the base 1. A loading motor M2 is connected to the ball screw 25 and operates to rotate the ball screw 25 selectively in a forward direction and in a reverse direction. The ball screw 25 is threaded onto a ball screw receiver (not shown) arranged in the tray support body. As the ball screw 25 rotates in the forward or reverse directions, the tray support body reciprocates between the tray replacement position P1 and the loading position P2. In other words, the loading tray, on which the electronic component T to be tested is mounted, is arranged on the tray support body and reciprocated between the tray replacement position P1 and the loading position P2.

The component unloading device 3C, which is illustrated in FIG. 1, unloads the electronic component T that has been tested and mounted on an unloading tray ET, from a position rearward in the width direction of the base 1, or an unloading position P3 in the vicinity of the component test portion 10, to a position forward in the width direction of the base 1, or a tray replacement position P4 spaced from the component test portion 10. Specifically, the component unloading device 30 has a pair of rails 31 extending from the tray replacement position P4 to the unloading position P3 along the width direction of the base 1. A tray support body 33 having a rail receiver 32, which moves on the rails 31, is mounted on the rails 31. An unloading tray ET having a plurality of pockets Pc, which are to hold electronic components T, is mounted on the top surface of the tray support body 33. A ball screw 35 is provided between the rails 31 and extends parallel with the rails 31. Each end of the bail screw 35 is rotatably supported by a holder 34 secured to the base 1. An unloading motor M3 is connected to the ball screw 35 and operates to rotate the ball screw 35 selectively in a forward direction and in a reverse direction. A ball screw receiver (not shown), which is provided in the tray support body 33, is threaded onto the ball screw 35. As the ball screw 35 rotates in the forward or reverse direction, the tray support body 33 reciprocates between the tray replacement position P4 and the unloading position P3. In other words, the unloading tray ET, on which the electronic component T that has been tested is mounted, is arranged on the tray support body 33 and reciprocated between the tray replacement position P4 and the unloading position P3.

The component test portions 10 including the test sockets Sc, which are illustrated in FIG. 2, the loading position P2 in the component loading device 20, and the unloading position P3 in the component unloading device 30 are aligned along a line in the longitudinal direction of the base 1. Such alignment is referred to as a component transport line.

A first transport device 40A and a second transport device 40B are arranged on the base 1 to be opposed to each other at both sides of the component test portion 10 in the width direction of the base 1, or both sides of the component transport line in the width direction of the base 1. The first transport device 40A is located forward of the component transport line with, respect to the width direction of the base 1. The second transport device 403 is arranged rearward of the component transport line with respect to the width direction of the base 1. The first and second transport devices 40A, 40B each include a plate-like transport hand support body 41, which extends perpendicular to the top surface of the base 1 and parallel with the component transport line. Each of the transport hand support bodies 41 includes an inner surface 41a facing the component test portion 10 and an outer surface 41b, which is located opposite to the inner surface 41a. In ether words, the first and second transport devices 40A, 40B are arranged on the base 1 in such a manner that the inner surfaces 41a of the transport hand support bodies 41 of the transport devices 40A, 40B are opposed to each other. Each transport hand support body 41 are arranged in such a manner as to straddle the component loading device 20 and the component unloading device 30. A pair of rails 42, which extend parallel with the component transport line and have a length corresponding to the distance between the component loading device 20 and the component unloading device 30, are provided on the outer surface 41b of the transport hand support body 41 located forward in the width direction of the base 1. A horizontal movable body 43 is mounted on the rails 42 and moves horizontally on the rails 42 through a non-illustrated rail receiver moving on the rails 42. That is, the horizontal movable body 43 reciprocates along the rails 42 while guided through the rail receiver. A bail screw 45, which extends parallel with the rails 42, is provided between the rails 42. Both ends of the ball screw 45 are rotatably supported by two holders 44, which are secured to the outer surface 41b of the transport hand support body 41. One end of the bail screw 45 is connected to a horizontal motor M4, which operates to rotate the bail screw 45 selectively in a forward direction and in a reverse direction. A bearing portion 43g formed in the horizontal movable body 43 is threaded onto the ball screw 45. As the ball screw 45 rotates in the forward or reverse directions, the horizontal movable body 43 horizontally reciprocates between a position above the component loading device 20 and a position above the component unloading device 30.

The horizontal movable body 43 supports a transport hand 50, which is located at the side corresponding to the inner surface 41a of the transport hand support body 41, through a pair of horizontal joint bodies 46 aligned in a vertical direction. Specifically, the lower horizontal joint body 46 extends from a lower portion of the horizontal movable body 43 toward the inner surface 41a of the transport hand support body 41 through the space defined between the portion of the transport hand support body 41 straddling the component loading device 20 and the component unloading device 30, and the upper surface of the base 1. The upper horizontal joint body 46 extends from an upper portion of the horizontal movable body 43 toward the inner surface 41a of the transport hand support body 41 through a guide bore 41d that extends through the transport hand support body 41 and parallel with the rails 42. One transport hand 50 is connected to the distal ends of the two horizontal joint bodies 46. This arrangement allows the transport hand 50 to horizontally reciprocate between the position above the component loading device 20 and the position above the component unloading device 30 as the horizontal movable body 43 moves in the horizontal direction.

Figure 3:
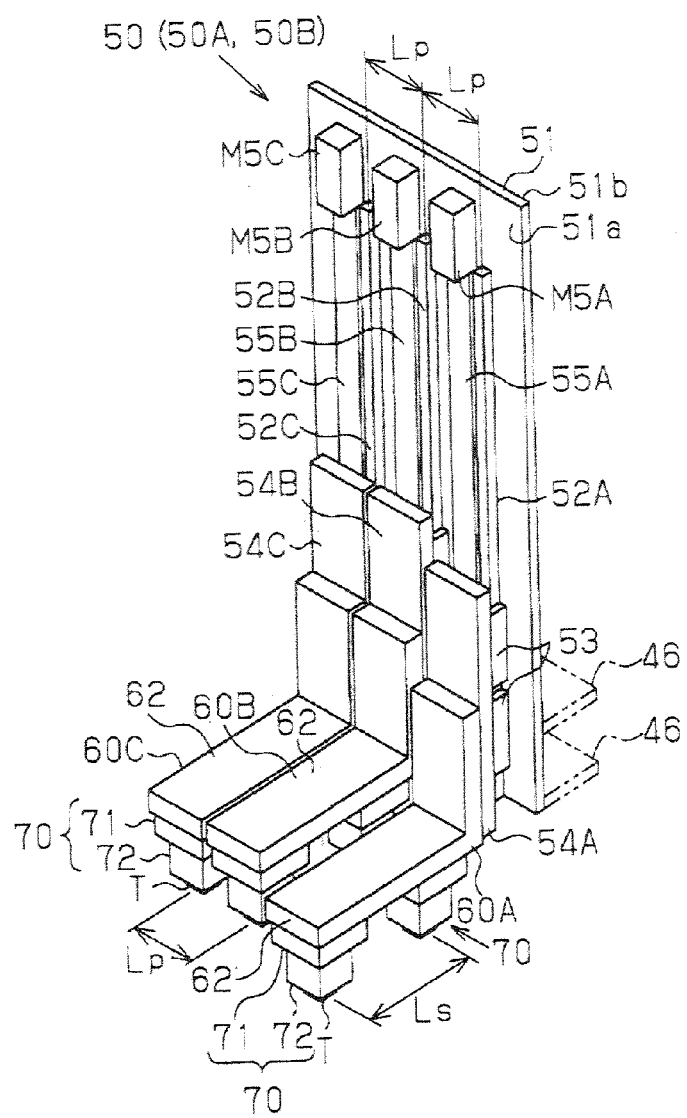
FIG. 3 is a perspective view showing a transport hand of the component test apparatus illustrated in FIG. 1.

As shown in FIG. 3, the transport hand 50 includes a vertical support body 51, which is shaped substantially as a vertically elongated rectangle. The distal ends of the horizontal joint bodies 46 are connected to a lower portion of the vertical support body 51. The vertical support body 51 includes an inner surface 51a facing the component rest portion 10 and an outer surface 51b facing the corresponding transport hand support body 41. Three rails 52A, 52B, 52C, which extend vertically with respect to the base 1, are arranged on the inner surface 51a of the vertical support body 51 and spaced apart at equal intervals. Each adjacent pair of the rails 52A, 52B, 52C are spaced from each other by an interval Lp. Vertical movable bodies 54A, 54B, and 54C, each of which is movable in a vertical direction through a pair of rail receivers 53, are provided on the rails 52A, 52B, and 52C, respectively. Ball screws 55A, 55B, 55C, which extend parallel with the rails 52A, 52B, 52C, are also provided. Vertical motors M5A, M5B, and M5C, each of which operates independently, are connected to the upper ends of the ball screws 55A, 55B, and 55C, respectively. Each one of the vertical motors M5A, M5B, M5C operates to rotate the corresponding one of the ball screws 55A, 55B, 55C selectively in a forward direction and in a reverse direction. A ball screw receiver (not shown) formed in each one of the vertical movable bodies 54A, 54B, 54C is threaded onto the corresponding one of the ball screws 55A, 55B, 55C. In other words, each one of the vertical movable bodies 54A, 54B, 54C selectively ascends and descends along the corresponding one of the rails 52A, 52B, 52C as the associated one of the ball screws 55A, 55B, 55C rotates in the forward or reverse directions.

Each vertical movable body 54A, 54B, 54C includes index units 60A, 60B, 60C. Each of the index units 60A, 60B, 60C includes a horizontal portion 62 extending perpendicular to the inner surface 51a of the vertical support body 51. Each one of the horizontal portions 62 is secured to the corresponding one of the vertical movable bodies 54A, 54B, 54C. Specifically, the horizontal portion 62 of each index unit 50A, 60B, 60C has a lower surface horizontal with the component test portion 10 of the base 1 and has such a length that the horizontal portion 62 opposes both of the test sockets Sc, the centers of which are spaced apart at the interval Ls. Accordingly, the horizontal portion 62 of each index unit 60A, 60B, 60C selectively approaches and separates from the test sockets Sc at a test position at which the horizontal portion 62 faces the test sockets Sc through vertical movement of the corresponding vertical movable body 54A, 54B, 54C.

The index unit 60A has two component holding portions 70 each serving as a holding mechanism, which is formed on the lower surface of the horizontal portion 62. The centers of the two component holding portions 70 are spaced apart at the interval Ls. Each of the component holding portions 70 holds the electronic component T arranged in the pocked Pc (see FIG. 1) of the loading tray at the loading position P2 (see FIG. 1) and presses the electronic component T into the corresponding test socket Sc (see FIG. 2) at the test position. At the unloading position P3 (see FIG. 1), each component holding portion 70 arranges the electronic component T in the pocket Pc of the unloading tray ET (see FIG. 1). The component holding portion 70 has a pressing mechanism 71 and a suction mechanism 72, which is selectively raised and lowered by the pressing mechanism 71. The pressing mechanism 71 is allowed to project the suction mechanism 72 downward through a pneumatic piston, which is provided in the pressing mechanism 71. As the suction mechanism 72 is projected, the electronic component T in the test socket Sc is firmly pressed against the test socket Sc, thus electrically connecting the connection pins of the electronic component T to the contact pins of the test socket Sc. The suction mechanism 72 is connected also to a non-illustrated negative pressure generating device. A suction bore (not shown), on which the negative pressure generated by the negative pressure generating device acts, is defined in the bottom surface of the suction mechanism 72. To allow the component holding portion 70 to hold the electronic component T up from the loading tray, the negative pressure is caused in the suction bore of the bottom surface of the suction mechanism 72. This draws and brings the electronic component T in contact with the bottom surface of the component holding portion 70. To mount the electronic component T held by the suction mechanism 72 on the unloading tray ET (see FIG. 1), the suction bore of the bottom surface of the suction mechanism 72 is disconnected from the negative pressure generating device so that the pressure in the suction bore reaches the atmospheric level. This releases the electronic component T.

Since the index units 60E, 60C are configured identically with the index unit 60A, description thereof will be omitted. The width of the horizontal portion 62 of each index unit 60A, 60B, 60C may be set to any suitable value as long as the width is sufficiently great at least for arranging the component holding portions 70. The interval Lp between each adjacent pair of the vertical movable bodies 54A, 54B, 54C, to which the corresponding index units 60A, 60B, 60C are connected, is determined in correspondence with the width of the horizontal portion 62. In the present embodiment, the interval Lp will be referred to also as one pitch.

In this configuration, it is particularly desirable that a total of six pockets Pc be provided in the loading tray and the unloading tray, with three pockets Pc provided along the longitudinal direction of the base 1 and spaced apart at the intervals Lp and two pockets Pc defined in the width direction of the base 1 and spaced apart at the interval Ls. If the loading tray in which the pockets Pc are provided in this manner is employed, each of the first and second transport devices 40A, 40B selectively raises and lowers all of the index units 60A, 60B, 60C of the transport hand 50 simultaneously at the loading position P2, thus causing the six component holding portions 70 to hold six electronic components T up from the loading tray. Also, if the unloading tray ET in which the pockets Pc are provided in this manner is employed, each of the first and second transport devices 40A, 40B moves all of the index units 60A, 60B, 60C of the transport hand 50 simultaneously at the unloading position P3, thus mounting the six electronic components T held by the component holding portions 70 on the unloading tray ET.

Replacement of electronic components T with respect to the test sockets Sc by the component transport devices will hereafter be explained with reference to FIGS. 4A to 11B. In the following, the transport hand 50 of the first transport device 40A will be referred to as a first transport hand 50A and the transport hand 50 of the second transport device 40B will be referred to as a second transport hand 50B. In the first transport hand 50A, the index unit 60A, the index unit 60B, and the index unit 60C are arranged sequentially in this order from the loading position P2 of the component loading device 20 toward the unloading position P3 of the component unloading device 30. In the second transport hand 50B, the index unit 60C, the index unit 60B, and the index unit 60A are arranged sequentially in this order from the loading position P2 of the component loading device 20 toward the unloading position P3 of the component unloading device 30.

Figure 6A:
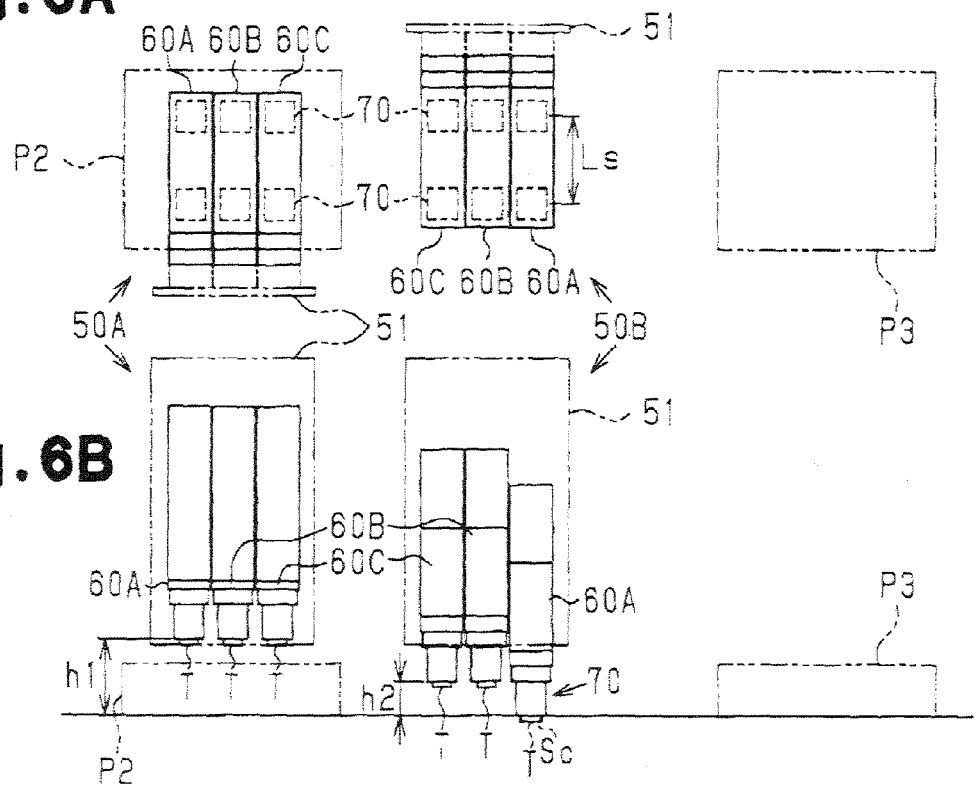
FIG. 6A is a plan view illustrating transport of an electronic component by the component test apparatus of FIG. 1.
Figure 6B:
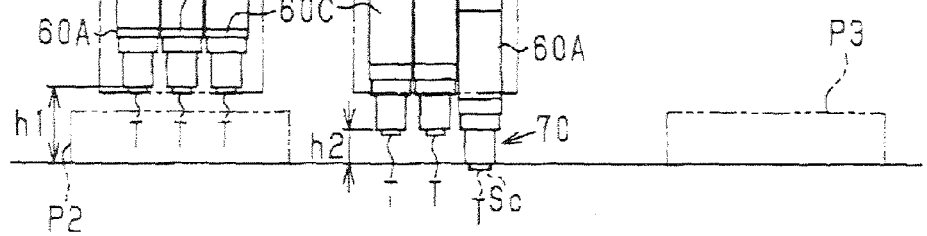
FIG. 6B is a front view of FIG. 6A.

FIGS. 6A and 6B illustrate the two electronic components T held by the index unit 60A of the second transport hand 50B arranged at the test position in a state subjected to an electrical test while held in the corresponding two test sockets Sc. In this state, the second transport hand 50B is located closer to the unloading position P3 than the first transport hand 50A. The electrical test on the electric components T requires a predetermined test time. The first transport hand 50A is arranged at the loading position P2 and the component holding portion 70 of the first transport hand 50A holds the electronic component T that is maintained in a standby state for the test. At this stage, the component holding portion 70 of each index unit 60A, 60B, 60C of the first transport hand 50A is raised at a first height h1, at which the first transport hand 50B is allowed to move toward the test position. The component holding portion 70 of each index unit 60B, 60C of the second transport hand 50B is located at a second height h2, which is spaced from the corresponding socket Sc by a predetermined distance.

Figure 7A:
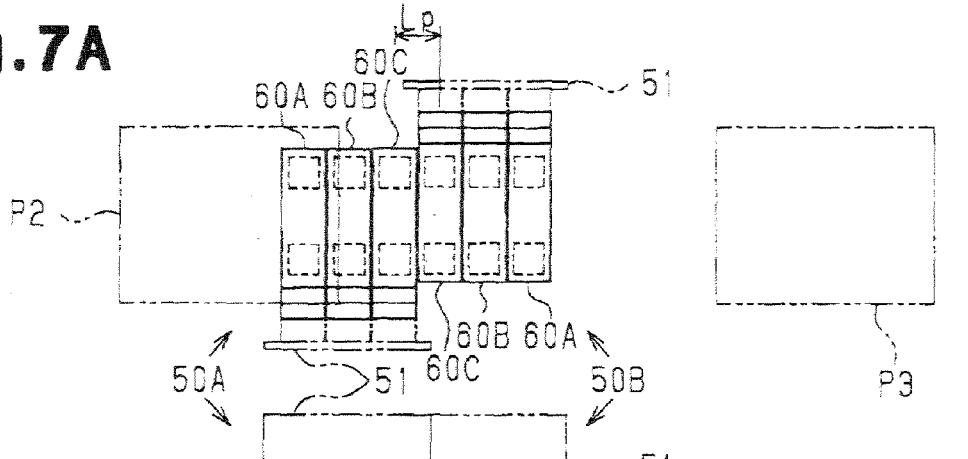
FIG. 7A is a plan view illustrating transport of an electronic component by the component test apparatus of FIG. 1.
Figure 7B:
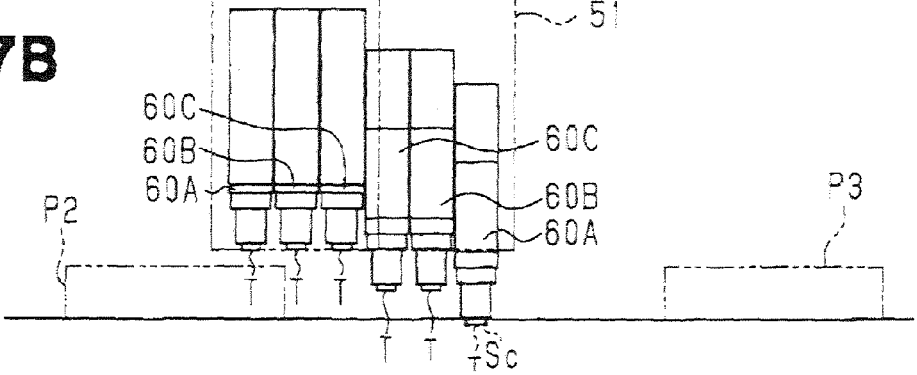
FIG. 7B is a front view of FIG. 7A.

Subsequently, with reference to FIGS. 7A and 7B, with the index unit 60A of the second transport hand 50B arranged at the test position, the first transport hand 50A moves toward the test position while maintaining the component holding portion 70 at the first height h1. As a result, the index unit 60C of the first transport hand 50A approaches the index unit 60C of the second transport hand 50B until the interval between the index units 60C becomes equal to the interval Lp.

Figure 8A:
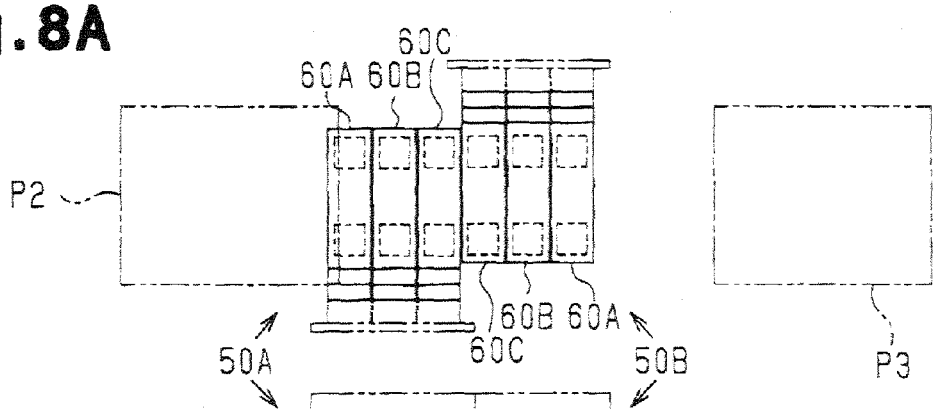
FIG. 8A is a plan view illustrating transport of an electronic component by the component test apparatus of FIG. 1.
Figure 8B:
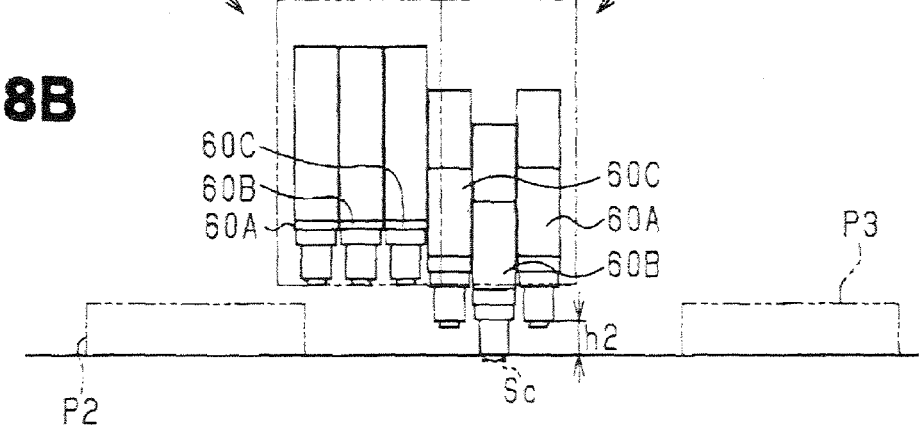
FIG. 8B is a front view of FIG. 8A.

After the predetermined test time has elapsed and the test on the two electronic components T held by the index unit 60A of the second transport hand 50B ends, the electronic components T are separated from the test sockets Sc and the component holding portion 70 of the index unit 60A of the second transport hand 50B is raised to the second height h2. Then, as illustrated in FIGS. 8A and 8B, the second transport hand 50B moves in an unloading direction, or toward the unloading direction P3, by a single pitch so that the index unit 60B of the second transport hand 50B is located at the test position. The two electronic components T held by the index unit 60B are thus arranged in the corresponding test sockets Sc and subjected to the electrical test. Meanwhile; the first transport hand 50A is moved in the unloading direction by a single pitch synchronously with the second transport hand 50B.

Figure 9A:
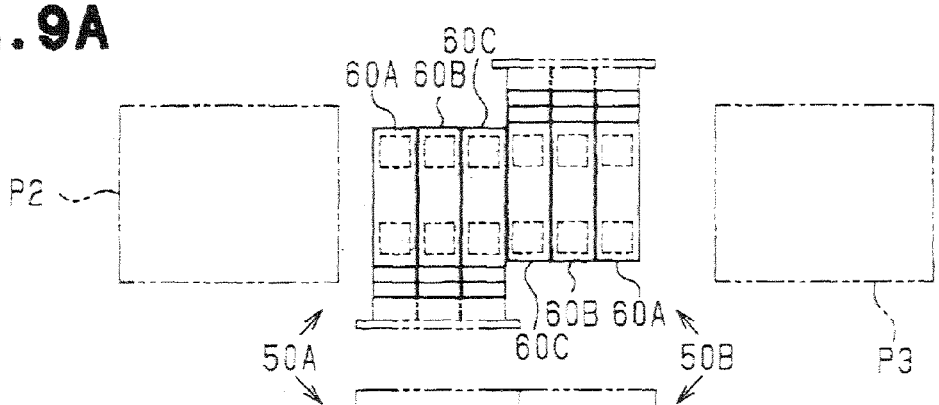
FIG. 9A is a plan view illustrating transport of an electronic component by the component test apparatus of FIG. 1.
Figure 9B:
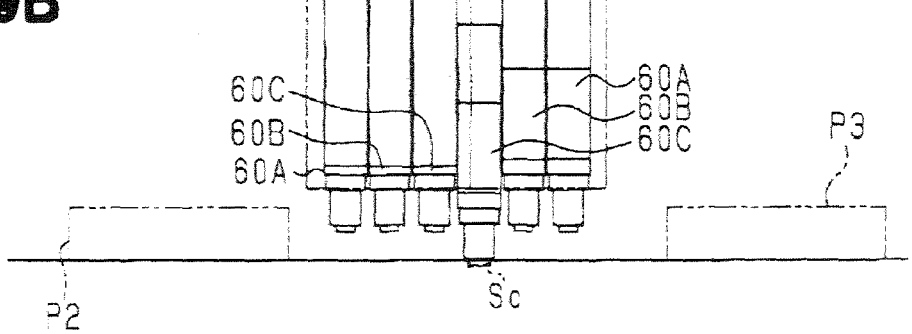
FIG. 9B is a front view of FIG. 9A.

Subsequently, after the predetermined test time has elapsed and the test on the two electronic components T held by the index unit 60B of the second transport hand 50B ends, the electronic components T held by the index unit 60B are separated from the test sockets Sc and the component holding portion 70 of the index unit 60B of the second transport hand 50B is raised to the second height h2. Then, as illustrated in FIGS. 9A and 9B, the second transport hand 50B moves in the unloading direction by a single pitch so that the index unit 60C of the second transport hand 50B is located at the test position. The two electronic components T held by the index unit 60C are thus arranged in the corresponding test sockets Sc and subjected to the electrical test. Meanwhile, the first transport hand 50A is also moved in the unloading direction by a single pitch synchronously with the second transport hand 50B and the component holding portions 70 of the first transport hand 50A are lowered to the second height h2.

Figure 4A:
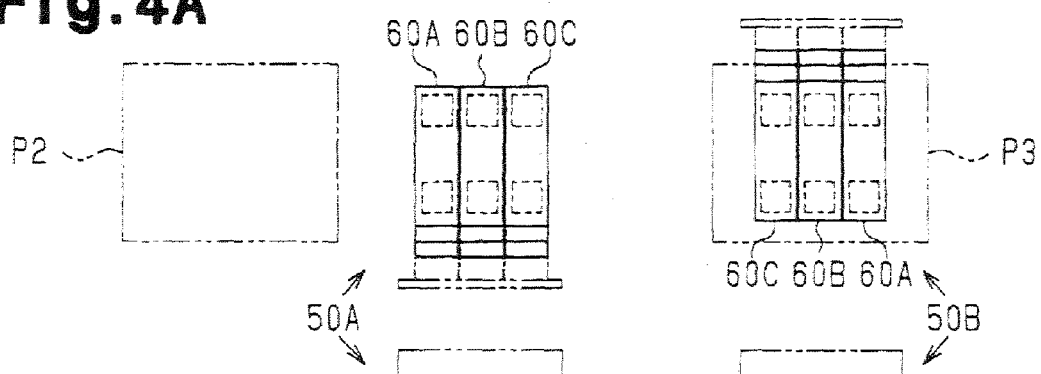
FIG. 4A is a plan view illustrating transport of an electronic component by the component test apparatus of FIG. 1.
Figure 4B:
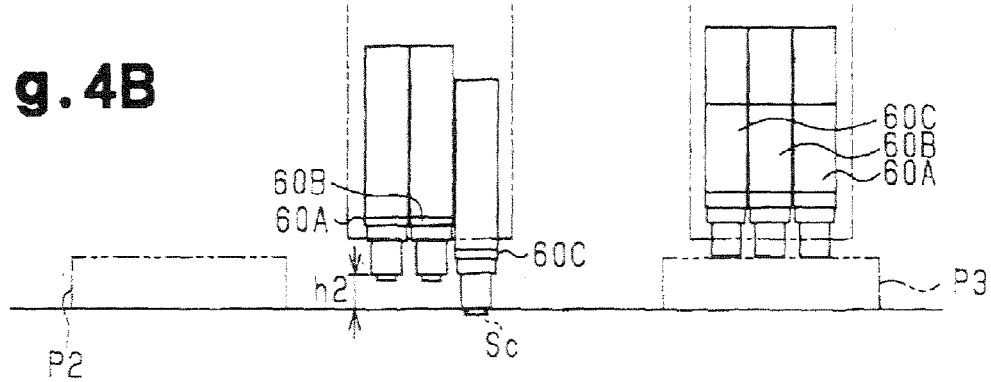
FIG. 4B is a front view of FIG. 4A.
Figure 5A:
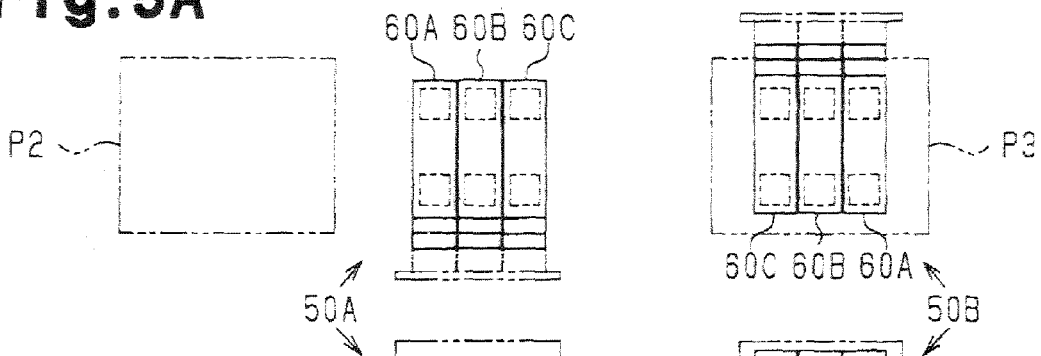
FIG. 5A is a plan view illustrating transport of an electronic component by the component test apparatus of FIG. 1.
Figure 5B:
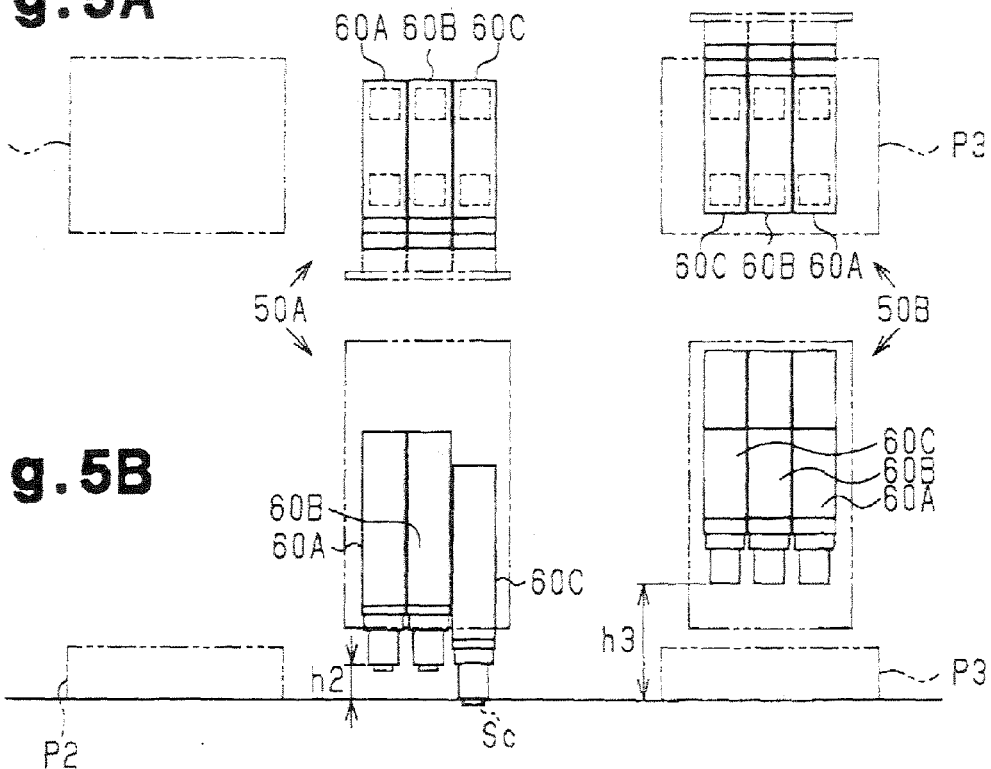
FIG. 5B is a front view of FIG. 5A.
Figure 10A:
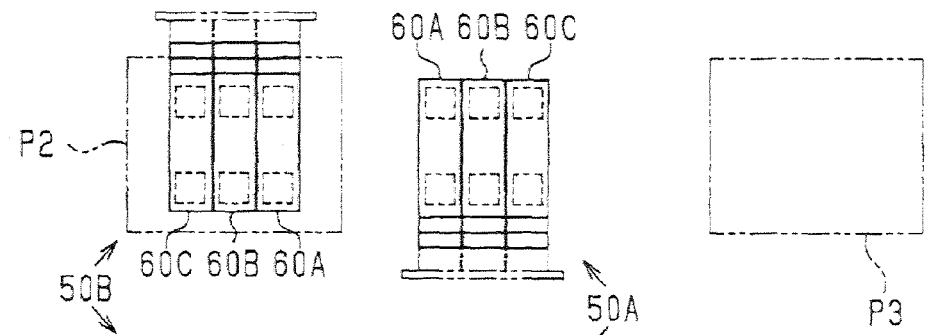
FIG. 10A is a plan view illustrating transport of an electronic component by the component test apparatus of FIG. 1.
Figure 10B:
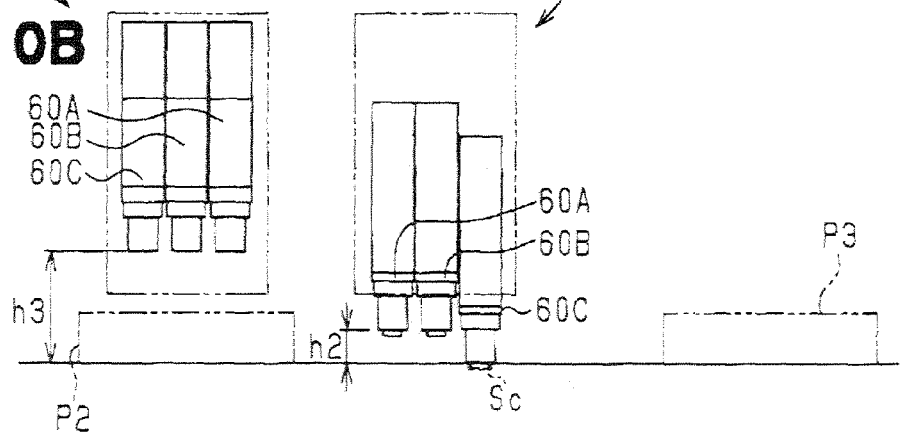
FIG. 10B is a front view of FIG. 10A.

After the predetermined test time has elapsed and the test on the two electronic components T held by the index unit 60C of the second transport hand 50B ends, the electronic components T held by the index unit 60C are separated from the test sockets Sc and the second transport hand 50B is moved in the unloading direction. Then, as illustrated in FIGS. 4A and 4B, the first transport hand 50A moves in the unloading direction by a single pitch so that the index unit 60C of the first transport hand 50A is located at the test position. The two electronic components T held by the index unit 60C are thus arranged in the corresponding test sockets Sc and subjected to the electrical test. Meanwhile, the second transport hand 50B is moved in the unloading direction and reaches the unloading position P3. At the unloading position P3, all of the electronic components T that have been subjected to the test are mounted on the unloading tray ET. Afterwards, with reference to FIGS. 5A and 5B, the second transport hand 50B rises from the unloading position P3 to a third height (a return height) h3, at which the second transport hand 50B does not contact the first transport hand 50A, which is located at the second height h2, and returns to the loading position P2. As illustrated in FIGS. 10A and 10B, the second transport hand 50B returns from the unloading position P3 to the loading position P2 without contacting the first transport hand 50A. That is, the position of the first transport hand 50A is replaced by the position of the second transport hand 50B in such a manner that the first transport hand 50A is arranged closer to the unloading position P3 than the second transport hand 50B. In other words, the first transport hand 50A and the second transport hand 50B perform rotary movement.

Figure 11A:
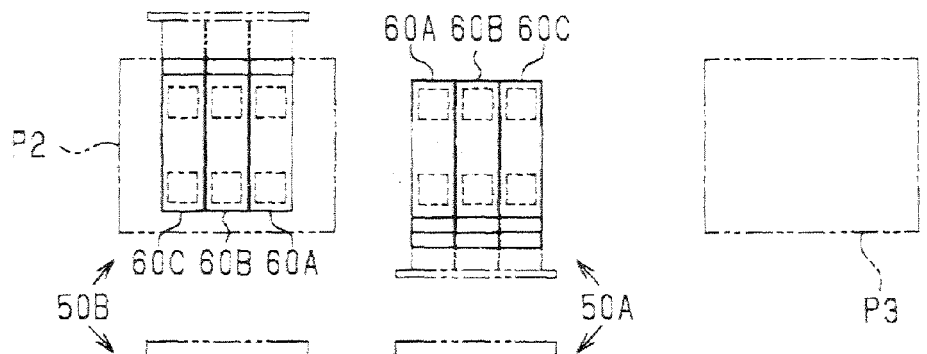
FIG. 11A is a plan view illustrating transport of an electronic component by the component test apparatus of FIG. 1.
Figure 11B:
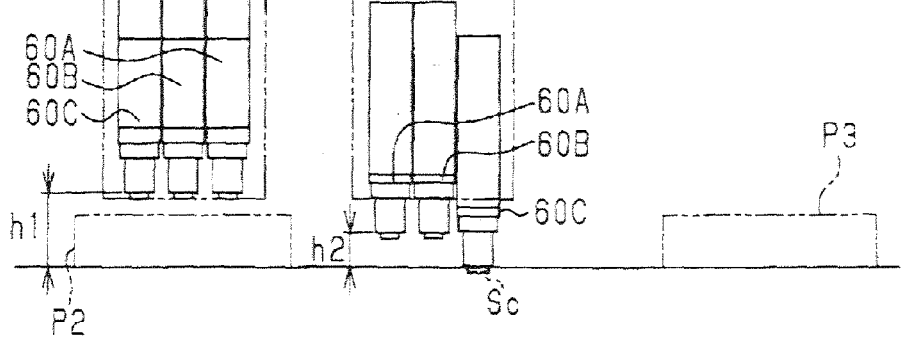
FIG. 11B is a front view of FIG. 11A.

Further, as illustrated in FIGS. 11A and 11B, after the second transport hand 50B, which has been moved to the loading position P2, simultaneously holds the six electronic components T that have been supplied to the loading position P2, the heights of the component holding portions 70 of the index units 60A to 60C of the second transport hand 50B are lowered to the first height h1. The second transport hand 50B is then moved toward the first transport hand 50A. At this stage, if the time necessary for unloading and loading of the electronic components T by means of the second transport hand 50B, which has been described so far, is shorter than the time consumed by the electrical test on all of the electronic components T held by the first transport hand 50A, the index unit 60A of the second transport hand 50B is allowed to move to the position adjacent to the first transport hand 50A, which is located at the test position, as in the state illustrated in FIG. 7.

In the present embodiment, the index units 60A to 60C of the first transport hand 50A and the index units 60A to 60C of the second transport hand 50B are arranged at the test position sequentially and repeatedly. As a result, the two electronic components T held by the two component holding portions 70 of each index unit 60A to 60C of the first and second transport hands 50A, 50B are sequentially delivered to the test position. Also, replacement of the electronic components T with respect to the test sockets Sc is carried out simply by moving the transport hands 50A, 50B in a horizontal direction by a single pitch and the corresponding index units 60A to 60C in a vertical direction by the distance corresponding to the second height h2. This greatly reduces the time necessary for replacement of the electronic components T with respect to the test sockets Sc and reliably improves the throughput of the test on the electronic components T.

The present embodiment has the following advantages.

(1) The transport hand 50 (50A, 50B; includes the multiple index units 60A, 60B, 60C. This makes it unnecessary to move the index unit 60A (or 60B) to the unloading position P3 immediately after the test on the electronic component T, which is held by the single index unit 60A (or 60B) and arranged in the test socket Sc, is completed. In other words, after the test on all of the electronic components T held by the multiple index units 60A, 60B, 60C ends, the electronic units T of the corresponding transport hand 50 is simply moved to the unloading position P3 as one unit. This reliably shortens the time required for replacement of the electronic components T with respect to the test sockets Sc and optimally enhances the throughput of the component test apparatus to perform the test on the electronic components T, including the transport time.

(2) Each transport hand 50 transports the electronic components T held by the index units 60A, 60B, 60C as one unit, and the two transport hands 50 (50A, 50B) transport the electronic components T repeatedly. As a result, the electronic components T are constantly arranged in the test sockets Sc in a sequential manner. Further, while the test time necessary for one transport hand 50 as one unit is elapsing, the other transport hand 50 is allowed to load or unload the corresponding electronic components T. Accordingly, the throughput of the component test apparatus in the test performed on the electronic components T depends only on the time consumed by the test carried out through the test sockets Sc. Since the test time is shortened, the throughput of the test on the electronic components T reliably improves.

(3) Providing two transport hands 50A, 50B is sufficient for allowing one transport hand 50 to load and unload electronic components T during the test time of the other transport hand 50 as one unit. The two transport hands 50A, 50B perform rotary movement in such a manner that the index units 60A, 60B, 60C of one transport hand 50A, 50B and the index units 60A, 60B, 60C of the other transport hand 50A, 50B vertically pass each other while facing each other. This greatly saves the two dimensional area for installing the component test apparatus.

(4) Each index unit 60A, 60B, 60C includes the component holding portion 70 having at least the suction mechanism 72 and the pressing mechanism 71. The suction mechanism 72 draws and holds an electronic component. The pressing mechanism 71 presses the electronic component into the corresponding test socket. This configuration provides each index unit 60A, 60B, 60C with holding function that is necessary and sufficient for holding the electronic component T in the range between the loading position P2 or the unloading position P3 of the component and the corresponding test socket Sc by means of the associated component holding portion 70.

(5) Since each transport hand 50 includes the component holding portions 70 that are aligned in correspondence with the alignment of the test sockets Sc, the throughput of the component test apparatus is expected to be improved in correspondence with the number of the aligned test sockets Sc.

The illustrated embodiment may be modified as follows.

As long as each test socket Sc is shaped in such a manner as to ensure electric connection between the electrodes of the electronic component, such as an IC, and the test socket Sc, the test socket Sc is not restricted to the shape of the illustrated embodiment.

There may be one or three or more test sockets Sc. In correspondence with the number of the test sockets Sc, one or three or more component holding portions 70 may be provided in each index unit 60A to 60C.

The test sockets Sc may be aligned either along the longitudinal direction of the base 1 or arranged in a matrix-like arrangement. In these cases, multiple index units, the dimension of which with respect to the movement direction of the transport hand is changed in correspondence with alignment of the test sockets Sc, are provided for each transport hand in a manner independently operable.

In the illustrated embodiment, the component transport line is defined by arranging the loading position P2, the test position, and the unloading position P3 in this order. However, the present invention is not restricted to this. The component transport line may be defined by arranging the positions in any suitable order, which is, for example, the unloading position, the loading position, and the test position or the loading position, the unloading position, and the test position. Also, the loading position and the unloading position do not necessarily have to be located separately from each other but may be arranged at a common position. In this case, the component loading device and the component unloading device may be provided as a common device.

In the illustrated embodiment, each transport hand 50A, 50B reciprocates along the component transport line. However, the present invention is not restricted to this. That is, after having moved from the loading position to the test position and then to the unloading position, the transport hand may move along a different path to return to the loading position. In this case, the path of the transport hand may be, for example, a curved path, a rotary path revolving on a plane, or a rotary path such as a belt conveyor. Also, each transport hand does not necessarily have to perform rotary movement.

Only one transport hand 50 may be provided. As long as the transport hand 50 includes a plurality of index units arranged adjacently, the time required for replacement of the electronic components with respect to the test sockets is shortened. Alternatively, three or more transport hands 50 may be employed.

As long as multiple index units are formed in each transport hand 50, the index units may be provided by any suitable number.

In the illustrated embodiment, the index units 60A, 60B, 60C of each transport hand 50A, 50B are operated sequentially and independently from one another. However, the present invention is not restricted to this. That is, in correspondence with the number of the test sockets or the alignment of the test sockets, the index units may be operated synchronously to arrange the electronic components in the test sockets. In this case, it is unnecessary to switch operating modes of the component test apparatus in correspondence with the number of the test sockets. This improves the productivity.

What is claimed is:

1. A component test apparatus performing a test on an electronic component, the apparatus comprising:
    a component loading device that loads the electronic component to a loading position;
    a transport hand capable of holding the electronic component so as to transport the electronic component from the loading position to a test socket arranged at a test position, and to transport from the tested test socket to an unloading position; and
    a component unloading device that unloads the electronic component from the unloading position,
    wherein the transport hand includes a plurality of index units each one of which is capable of holding the electronic component and operating independently from the other ones of the index units, the index units being aligned adjacently in a transport direction of the electronic component extending from the loading position toward the test position,
    wherein the transport hand is one of a plurality of transport hands, and wherein the transport hands are capable of performing rotary movement with respect to each other, and
    wherein the number of the transport hands is two, and wherein the two transport hands perform rotary movement in such a manner that the index units of one of the transport hands and the index units of the other transport hands vertically pass each other while facing each other.

2. The component test apparatus according to claim 1, wherein each of the index units includes a component holding portion that holds the electronic component, and wherein the component holding portion has a suction mechanism that draws and holds the electronic component and a pressing mechanism that presses the electronic component into the test socket.

3. The component test apparatus according to claim 2, wherein the test socket is one of a plurality of test sockets, the test sockets being aligned in a direction parallel with or perpendicular to a movement direction of the transport hand or arranged in a matrix-like arrangement, and wherein each of the index units includes the component holding portions the number of which corresponds to the number of the test sockets, the component holding portions being aligned in correspondence with alignment of the test sockets.

* * * * *